(12) United States Patent
Lee et al.

(10) Patent No.: US 7,157,300 B2
(45) Date of Patent: Jan. 2, 2007

(54) FABRICATION OF THIN FILM GERMANIUM INFRARED SENSOR BY BONDING TO SILICON WAFER

(75) Inventors: Jong-Jan Lee, Camas, WA (US); Jer-Shen Maa, Vancouver, WA (US); Sheng Teng Hsu, Camas, WA (US); Douglas J. Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/993,533

(22) Filed: Nov. 19, 2004

(65) Prior Publication Data

US 2006/0110844 A1 May 25, 2006

(51) Int. Cl.
*H01L 21/00* (2006.01)
(52) U.S. Cl. ............... 438/59; 438/200; 438/455; 438/93; 257/E27.133
(58) Field of Classification Search ........ 257/290–292, 257/458, 461, 462, E27.122, E27.133; 438/57, 438/59, 93, 200, 455
See application file for complete search history.

(56) References Cited

U.S. PATENT DOCUMENTS

| 5,610,409 | A  | * | 3/1997  | Leas et al. ............... 257/59 |
| 6,563,133 | B1 | * | 5/2003  | Tong ......................... 257/52 |
| 6,645,831 | B1 |   | 11/2003 | Shaeen et al. |
| 6,858,912 | B1 | * | 2/2005  | Marshall et al. ............ 257/438 |
| 7,002,175 | B1 | * | 2/2006  | Singh et al. ................. 257/25 |
| 2002/0016017 | A1 | * | 2/2002 | Sakai et al. ................. 438/57 |
| 2004/0060592 | A1 | * | 4/2004 | Machida et al. ............ 136/252 |
| 2005/0093021 | A1 | * | 5/2005 | Ouyang et al. ............. 257/194 |
| 2005/0093100 | A1 | * | 5/2005 | Chen et al. ................. 257/616 |
| 2005/0167709 | A1 | * | 8/2005 | Augusto ...................... 257/292 |
| 2005/0186759 | A1 | * | 8/2005 | So ............................. 438/459 |

OTHER PUBLICATIONS

Wolf, S., Silicon Processing for the VLSI Era vol. 2: Process Integration, Lattice Press, pp. 191, 1990.*
Colace et al., *Efficient high-speed near-infrared Ge photodetectors integrated on Si Substrates*, Applied Physics Letters, vol. 76, No. 10, pp. 1231-1233 (2000).
Lee et al., *Optimized Strained Si/Strained Ge Dual-channel Heterostructures for High Mobility P- and N-MOSFETs*, IEDM 2003, pp. 429-432.
Ritenour et al., *Epitaxial Strained Germanium p-MOSFETs with $HfO_2$ Gate Dielectric and TaN Gate Electrode*, IEDM 2003, pp. 433-436.

* cited by examiner

*Primary Examiner*—George R. Fourson
*Assistant Examiner*—John M. Parker
(74) *Attorney, Agent, or Firm*—Robert D. Varitz, PC

(57) ABSTRACT

A method of fabricating a thin film germanium photodetector includes preparing a silicon substrate; fabricating a CMOS device on the silicon substrate; preparing a germanium substrate; preparing surfaces of each substrate for bonding; bonding the germanium substrate to the CMOS-bearing silicon substrate to form a bonded structure; removing a portion of the germanium substrate from the bonded structure; forming a PIN diode in the germanium substrate; removing a portion of the germanium layer by etching; and completing the germanium photo detector.

20 Claims, 7 Drawing Sheets

FABRICATION OF THIN FILM GERMANIUM INFRARED SENSOR BY BONDING TO SILICON WAFER

FIELD OF THE INVENTION

This invention relates to photodetectors, and specifically to method of fabricating a germanium based IR sensor.

BACKGROUND OF THE INVENTION

Photo detecting in the near-infrared regime, e.g., wavelengths of between about 0.7 µm to 2 µm, has many applications, such as fiber-optical communication, security applications and thermal imaging. Silicon photodiodes are widely used as photodetectors for the visible light regime because of their low dark current and compatibility with silicon integrated circuit technologies. Attempts have been made to deposit $Si_{1-x}Ge_x$ (SiGe) alloys, or germanium thin films, in silicon to fabricate an IR detector, however, the lattice mismatch in a SiGe-to-silicon boundary limits the maximum SiGe thickness which may be formed while still maintaining a defect free structure. Additionally, SiGe thin films having a germanium concentration of less than 50% have a relatively low IR absorption coefficient. Hence, it is difficult to fabricate an IR detector on SiGe film which has high sensitivity and low dark current.

Germanium has a high IR absorption coefficient, however, a 4% lattice mismatch to silicon results in a high dark current when a germanium photodetector is fabricated by direct deposition of germanium on silicon. A germanium photodetector having a simple PN diode structure exhibiting a very high dark current, e.g., about 30 $mA/cm^2$, has been fabricated, Colace et al., *Efficient high-speed near-infrared Ge photodetectors integrated on Si substrates*, Applied Physics Letters, Vol. 76, No. 10, pp 1231–1233 (2000).

A germanium thin film bonded to silicon or silicon dioxide has been disclosed, wherein the IR sensor and the driving CMOS circuit are both fabricated on a germanium thin film. High temperature processes are required for germanium IC processes, i.e., ion implantation activation processes are usually performed following an annealing at about 800° C. Such high temperature processes degrade the quality of germanium thin films because the thermal expansion coefficient of silicon, germanium and silicon dioxide are different. A high temperature process performed on a germanium thin film which is bonded to a silicon wafer usually results in defects in the germanium layer(s), as described in U.S. Pat. No. 6,645,831, for Thermally stable crystalline defect-free germanium bonded to silicon and silicon dioxide, granted Nov. 11, 2003 to Shaheen et al. Additionally, germanium IC processes are not as well established in the semiconductor industry as are silicon IC processes.

A graded SiGe growth has been demonstrated to form a thick SiGe buffer layer prior to germanium growth, Lee et al., *Optimized Strained Si/Strained Ge Dual-channel Heterostructures for High Mobility P- and N-MOSFETs*, IEDM 2003, pp 429–432.

A Germanium p-MOSFET fabricated on bulk germanium and on epi-germanium has been disclosed by Ritenour et al., *Epitaxial Strained Germanium p-MOSFETs with $HfO_2$ Gate Dielectric and TaN Gate Electrode*, IEDM 2003, pp 433–436.

SUMMARY OF THE INVENTION

A method of fabricating a thin film germanium photodetector includes preparing a silicon substrate; fabricating a CMOS device on the silicon substrate; preparing a germanium substrate; preparing surfaces of each substrate for bonding; bonding the germanium substrate to the CMOS-bearing silicon substrate to form a bonded structure; removing a portion of the germanium substrate from the bonded structure; forming a PIN diode in the germanium substrate; removing a portion of the germanium layer by etching; and completing the germanium photo detector.

It is an object of the invention to eliminate the need for any high temperature process after germanium bonding.

Another object of the invention is to provide a method of using a silicon CMOS drive circuit in place of a germanium circuit.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Using the method of the invention, a germanium thin film is directly bonded to a silicon substrate to preserve the quality of the germanium crystal layer. This invention negates the need for high temperature processes after germanium bonding. High temperature process after bonding results in defects in a germanium thin film, e.g., thermal induced slip, bonding voids and crystalline defect. IC drive circuits are used on a silicon wafer, using standard front-end of line processes before the bonding process takes place. After a germanium thin film is bonded to a silicon wafer, the wafer is only required to undergo standard back-end processes of conventional silicon IC processes, wherein the maximum temperature is between about 300° C. to 400° C. The quality of germanium thin films may thus be preserved and a high efficiency, low noise IR detector may be fabricated. The use of the standard silicon CMOS process in fabrication of the drive circuit also simplifies the fabrication.

Figure 1:
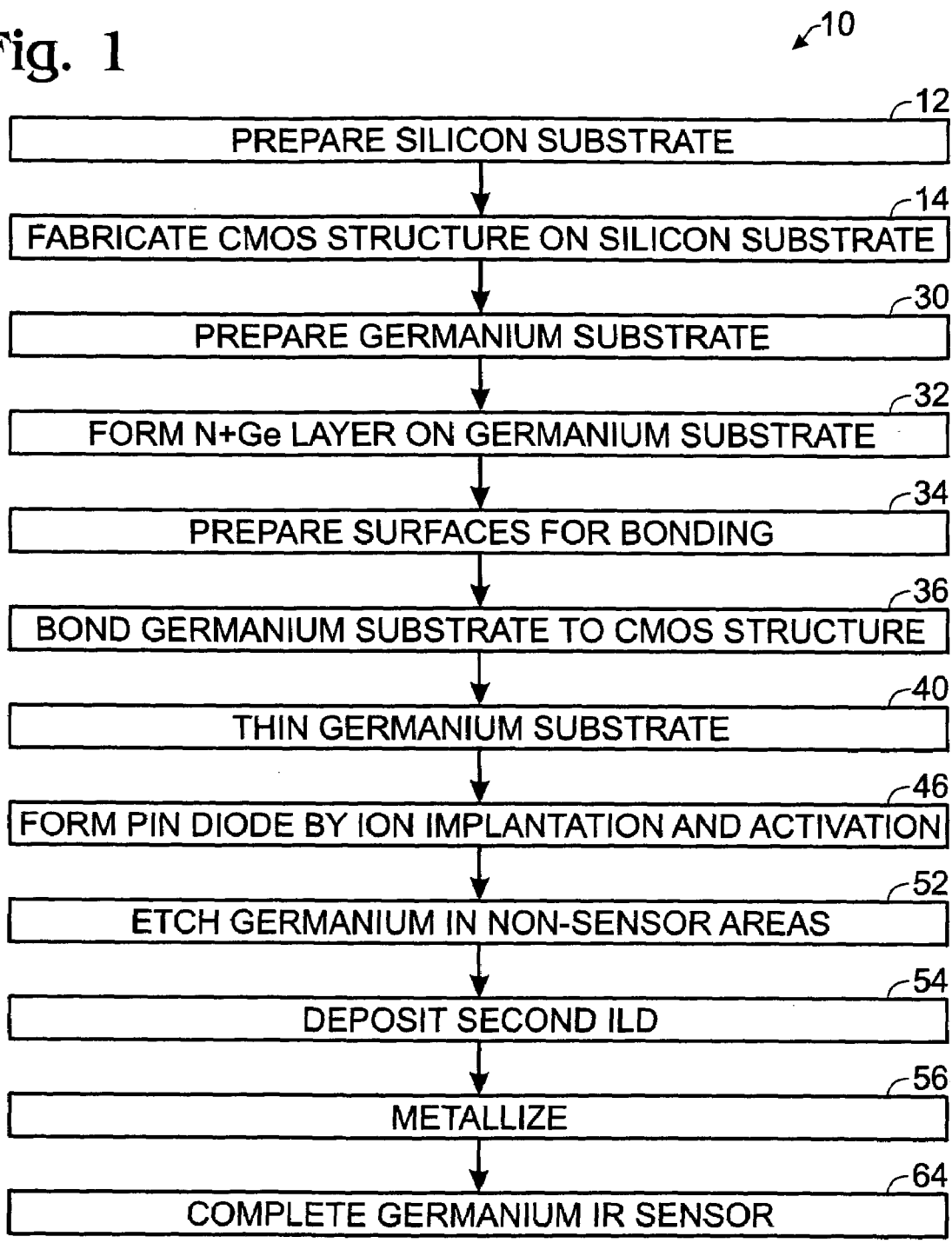
FIG. 1 is a block diagram of a first embodiment of the method of the invention.
Figure 2:
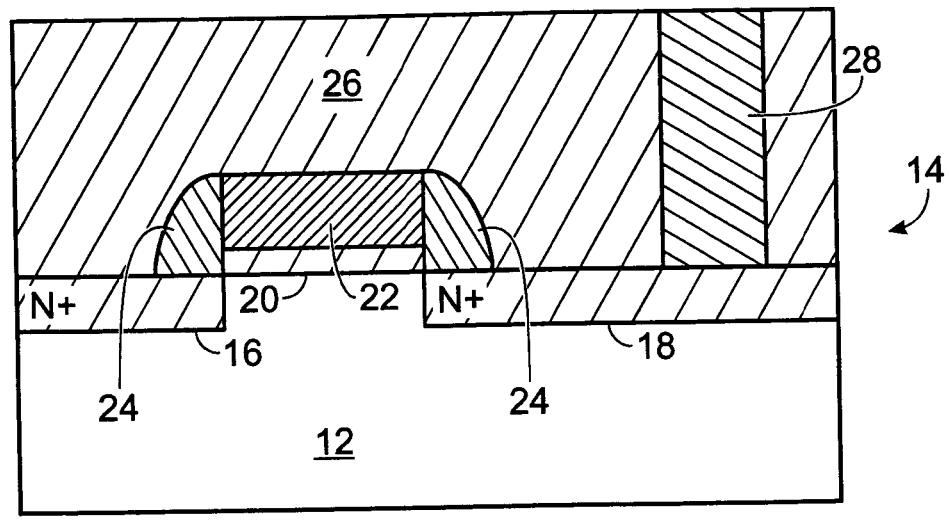
FIGS. 2–6 depict steps in practicing a first embodiment of the method of the invention.

A first embodiment of an integration of the silicon CMOS and germanium photodetector are now described in connection with FIG. 1, generally at 10, and FIGS. 2–6. FIG. 2 depicts a standard silicon CMOS device fabricated by a conventional process on a silicon substrate. The CMOS device is fabricated by initially preparing a silicon substrate 12, and forming a CMOS structure 14 on substrate 12, including forming N+ layer 16 as a drain, N+ layer 18 as a source, a gate dielectric 20, a polysilicon gate 22, gate sidewalls 24 and an inter-layer dielectric (ILD), likely $SiO_2$, 26. Only the NMOS portion of CMOS 14 is shown in the figures for the sake of clarity. The silicon wafer following formation of a contact plug CMP process, wherein a contact plug 28, as used in this description of the method of the invention, is formed of polysilicon, tungsten, or any other suitable conducting material. In FIG. 2, only contact plug 28 to the germanium photodetector is depicted, however, contacts to polysilicon gate 22 and to source 18 and drain 16 may also be fabricated at this stage. CMP planarization after filling the contact plug is necessary to create a smooth surface for bonding.

Figure 3:
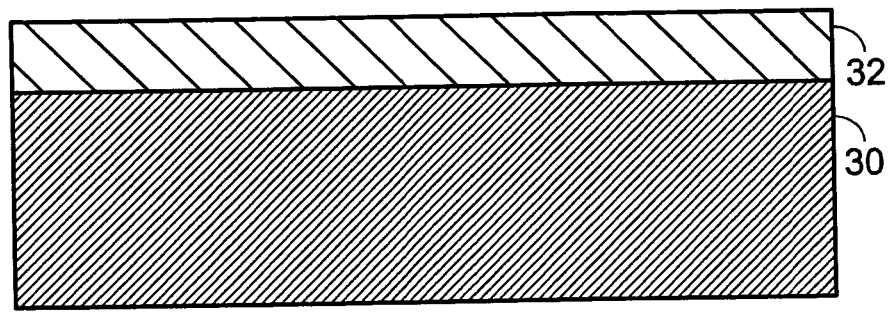

An alternative method of the invention is to CMP the inter-layer dielectric (ILD) layer, and then leave the conducting material, which filled the contact plug, on top of the ILD and function as a bonding surface for the germanium. FIG. 3 depicts a germanium wafer 30 having an N+ surface layer 32. N+ layer 32 may be formed by ion implantation of arsenic or phosphorus followed by subsequent dopant activation in the germanium substrate, or by in situ phosphorus or arsenic doping of the germanium N+ epi layer or germanium wafer. The germanium substrate has a relatively low doping concentration, e.g., either phosphorus or boron having a concentration of between about $1e14$ $cm^{-3}$ to $1e17$ $cm^{-3}$.

Figure 4:
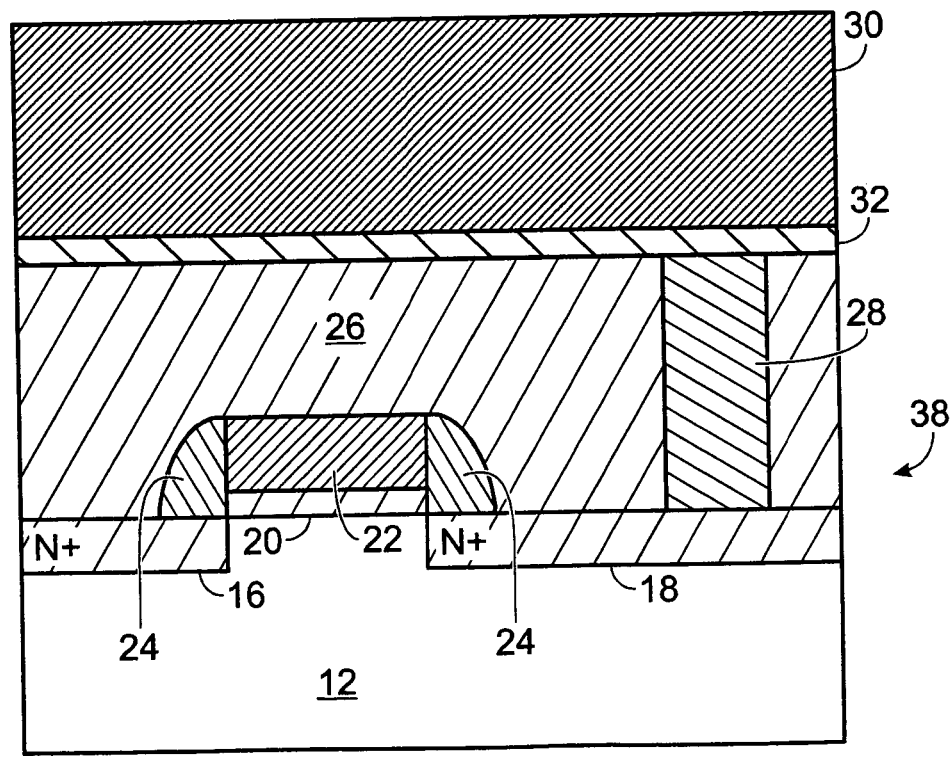

Silicon wafer 12 of FIG. 2 and germanium wafer 30 of FIG. 3 are then bonded together, FIG. 4, following proper surface treatment 34 of the bonding surfaces, which is necessary to create good bonding. Cleaning is performed after CMP to remove any particulate matter remaining on the bonding surfaces. The germanium surface may be treated as a hydrophilic or a hydrophobic substance, while the silicon wafer surface, which is mostly covered by $SiO_2$, may be treated in the same manner. The two elements are bonded together 36 to form a bonded structure 38. The bonding of germanium to $SiO_2$ is by hydrogen bonding, following surface treatment to render the bonding surfaces hydrophilic or hydrophobic, forming an OH layer on the wafer bonding surfaces. The wafer bonding surfaces may be rendered hydrophilic or hydrophobic by dipping in $H_2SO_4+H_2O_2+H_2O$, $NH_4OH+H_2O_2+H_2O$, $HF+H_2O$, or mixtures thereof.

Additionally, the either or both of the wafer bonding surfaces may undergo a plasma treatment, usually in an oxygen-containing atmosphere, to improve the bonding strength. Bonding may be perform at room temperature, or at a higher temperature, ($0°$ C.$<T<600°$ C.), and may be performed in vacuum or not. A conductive material, e.g., Au, may be inserted in the bonding interface to improve bonding strength. The conducting material may be deposited on the silicon wafer, the germanium wafer, or on both wafers prior to bonding.

A thinning process 40, such as CMP, is performed on the germanium substrate, as depicted in FIG. 4, resulting in a final germanium thickness of between about 50 nm to 2000 nm. Germanium thinning may also be done by wet etch.

Figure 5:
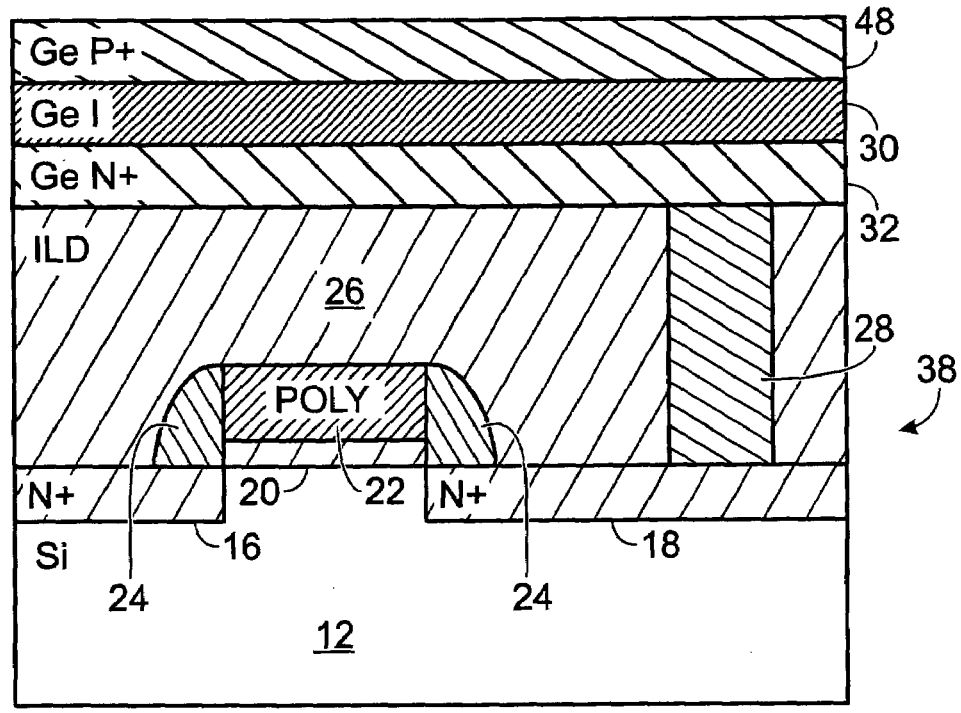

In order to form a PIN diode, as depicted in FIG. 5, P+, B or $BF_2$ ion implantation is performed and the dopant subsequently activated in germanium layer 30 by a low temperature, e.g., $400°$ C. to $800°$ C., anneal 46, to form a Ge P+ layer 48. Alternately, an in-situ B-doped germanium epitaxy process may be performed by CVD or MBE which, again, may be performed at a relatively low temperature, e.g., $350°$ C. to $500°$ C. In another alternate method of the invention, a metal, such as Ni, Ti, W, Mo, Cu, Zr, or Co may be deposited on the germanium surface. These materials form a relatively low level barrier to the lightly p-doped germanium. Therefore, the depletion region in the lightly P-doped germanium is extended from the N+ junction, causing most of the photo-generated electrons in the germanium to flow toward, and be collected by, the n+ junction.

Figure 6:
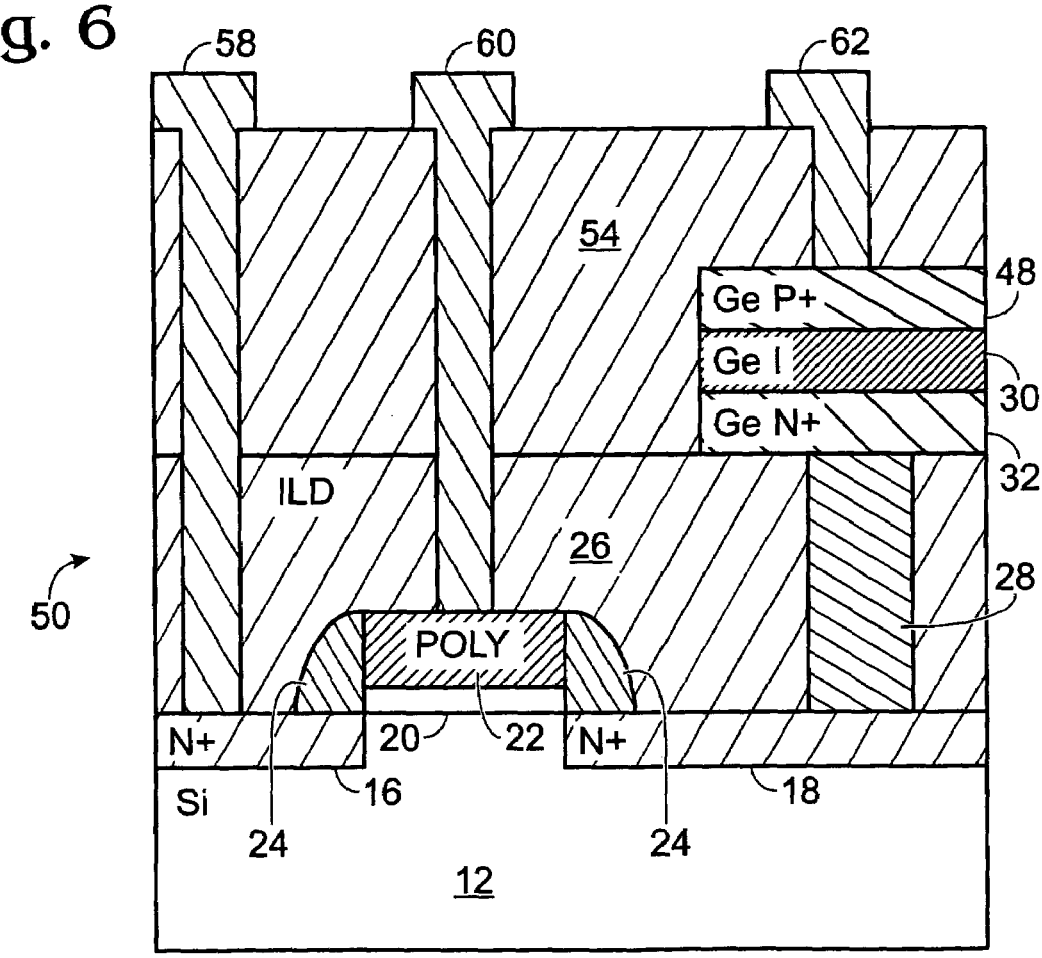

FIG. 6 depicts the device 50 after the germanium layer has been etched off 52 in non-sensor areas. After formation of a second ILD ($SiO_2$) 54, contact holes and metallization 56 to form contacts 58, 60 and 62, the device may be completed by standard silicon IC back-end-of-line processes, 64.

Figure 7:
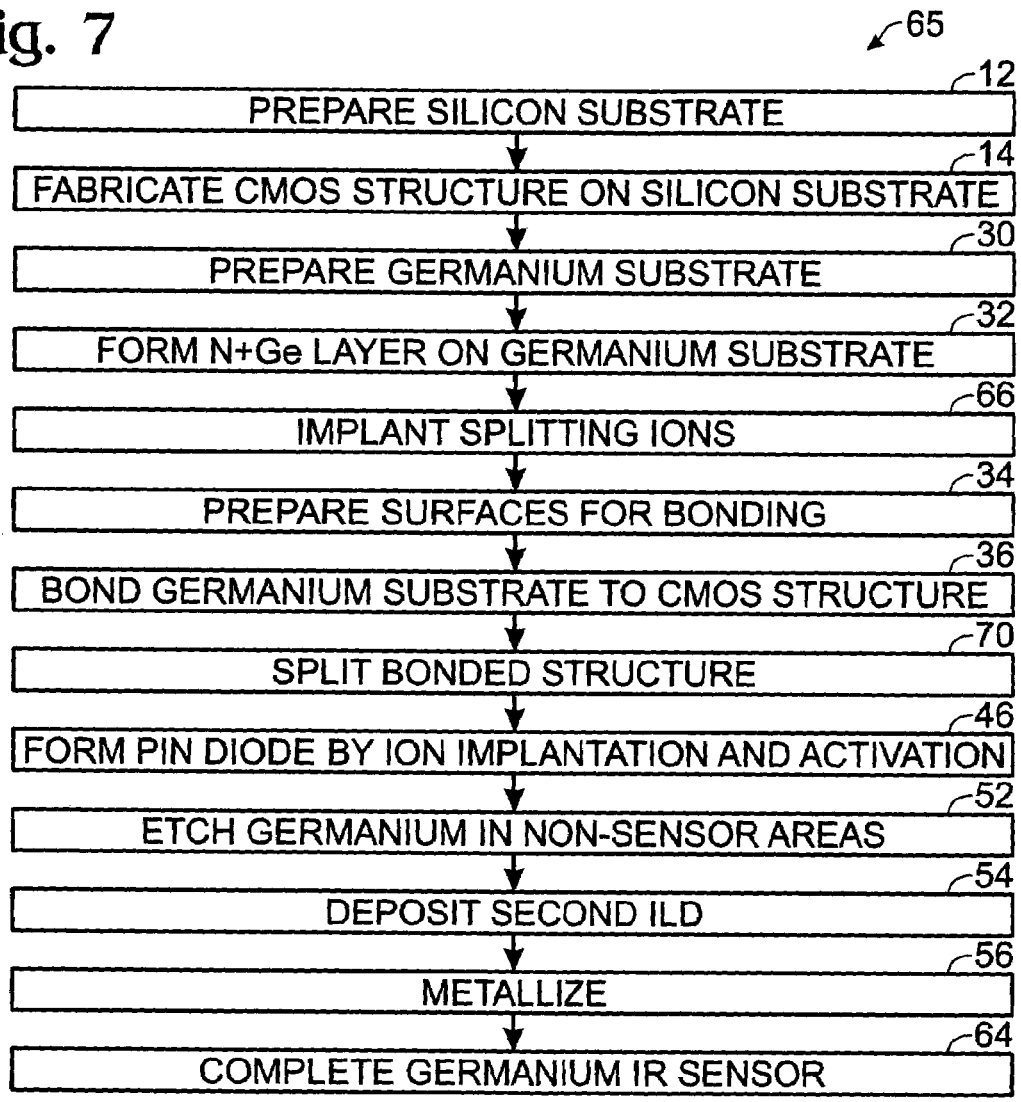
FIG. 7 is a block diagram of a second embodiment of the method of the invention.
Figure 8:
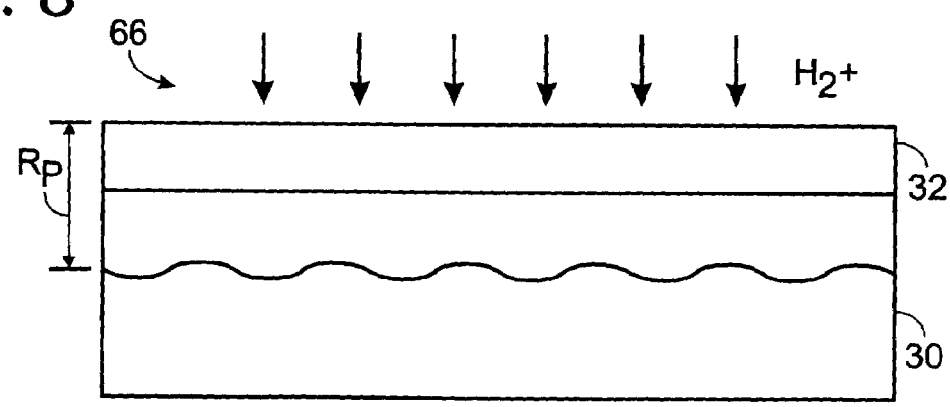
FIGS. 8–10 depict steps in practicing the second embodiment of the method of the invention.
Figure 9:
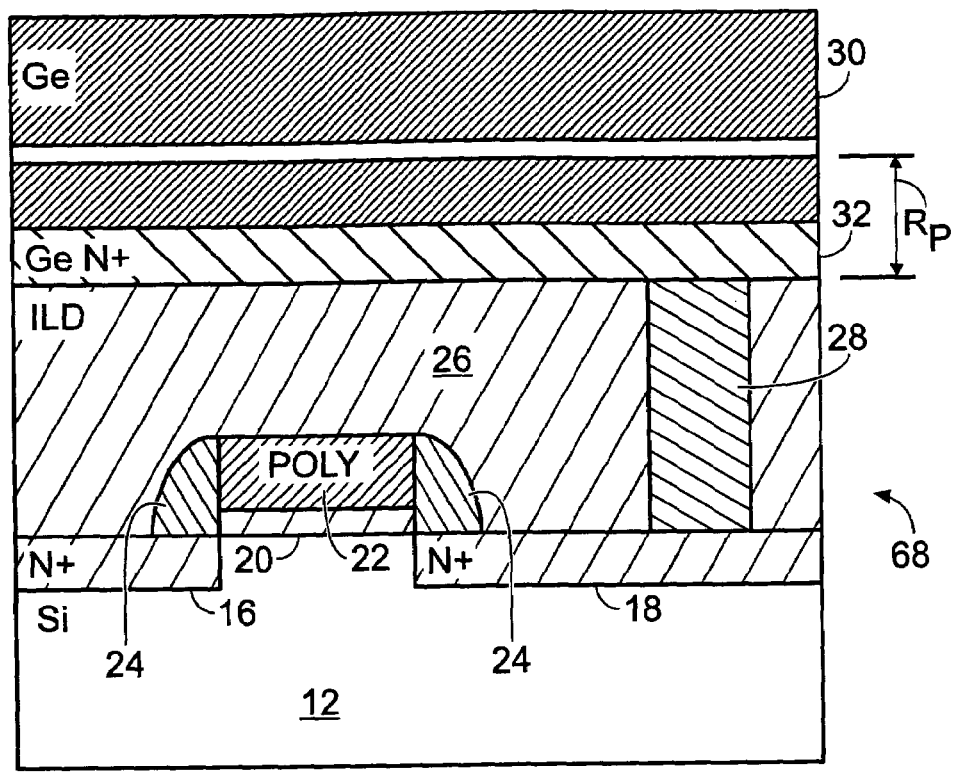
Figure 10:
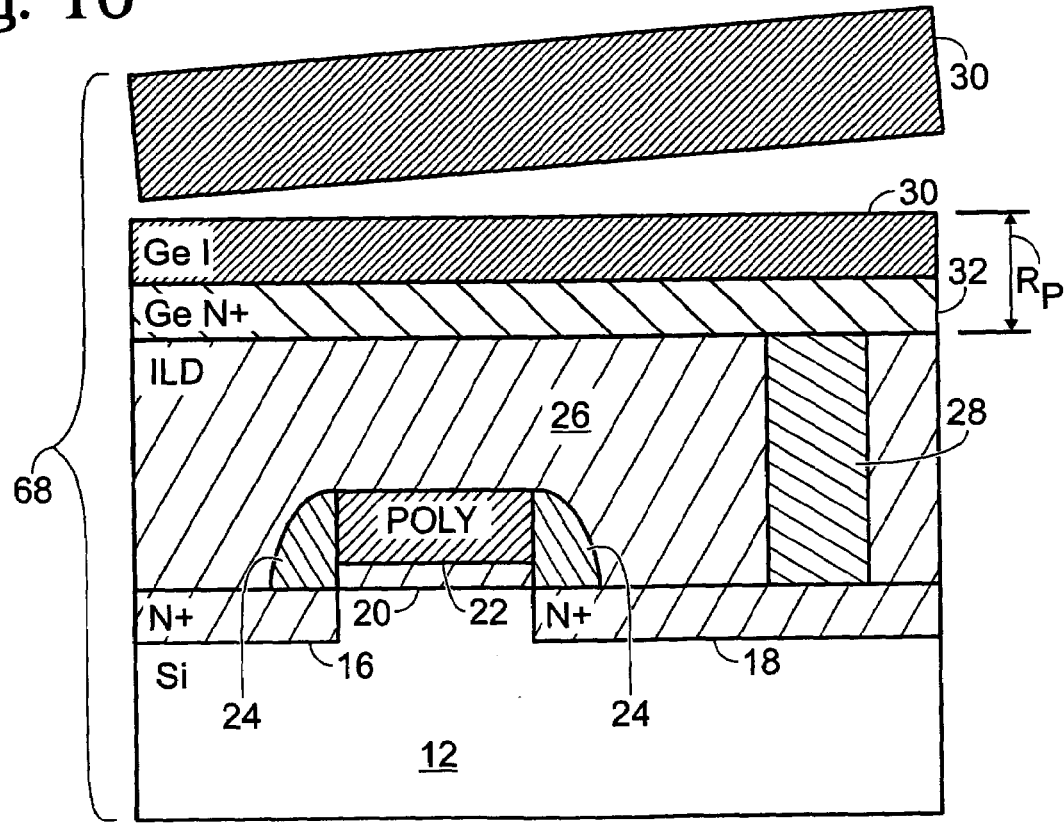

An alternative way to create thin germanium layer is to use an ion-splitting method, so that the germanium wafer may be reused. FIG. 7 depicts steps in this embodiment of the method of the invention, generally at 65. It is to be understood that like reference numbers in FIGS. 9–10 refer to like steps and structures in FIGS. 1–6. An ion splitting process begins, as shown in FIG. 8, by implantation of splitting ions, in the form of hydrogen, helium or argon, or a combination thereof, are implanted into a germanium wafer 30, having an N+ Ge layer 32 formed thereon, as described in connection with FIG. 3. The ions penetrate layer 32 and lodge in layer 30. The implantation energy depends on the required germanium thickness. The projection length, Rp, at which most of implanted species is located is very close to the germanium thickness after splitting. Rp is usually between about 0.3 μm and 2 μm. The implantation dose is between $5e15$ $cm^{-2}$ to $5e17$ $cm^{-2}$. After the bonding process is complete, forming a structure 68, FIG. 9, a splitting process 70 is performed by furnace annealing at a temperature between about $200°$ C. to $600°$ C., FIG. 10. After splitting, CMP may be applied to smooth the split germanium surface. Although germanium wafers are presently available in a 200 mm diameter, the production of germanium wafers is not as mature a technology as is the production of silicon wafers. The price of a germanium wafer is ten to one-hundred times more than for a comparable silicon wafer. Therefore, an alternate embodiment of the method of the invention requires preparation of a germanium film on a silicon wafer, as described by Lee et al., supra, and Ritenour et al., supra. The epitaxial germanium film grown on a silicon wafer is then bonded and transferred to the CMOS-bearing silicon wafer, as previously described.

The germanium near-IR photodetector integrated with silicon CMOS technology requires three to four layers of metal interconnect on the back-end-of-line (BEOL) IC process. In a variation of the method of the invention wherein a germanium photodetector is fabricated prior to the BEOL IC process, the bonding/transferring of the germanium layer and fabrication of the germanium photodetector element may be performed with the BEOL, or after completion of the BEOL IC interconnect process. The advantage of processing the germanium photodetector after completion of the BEOL process is that the metal interconnect doe not prevent light from reaching the germanium photodetector.

Figure 11:
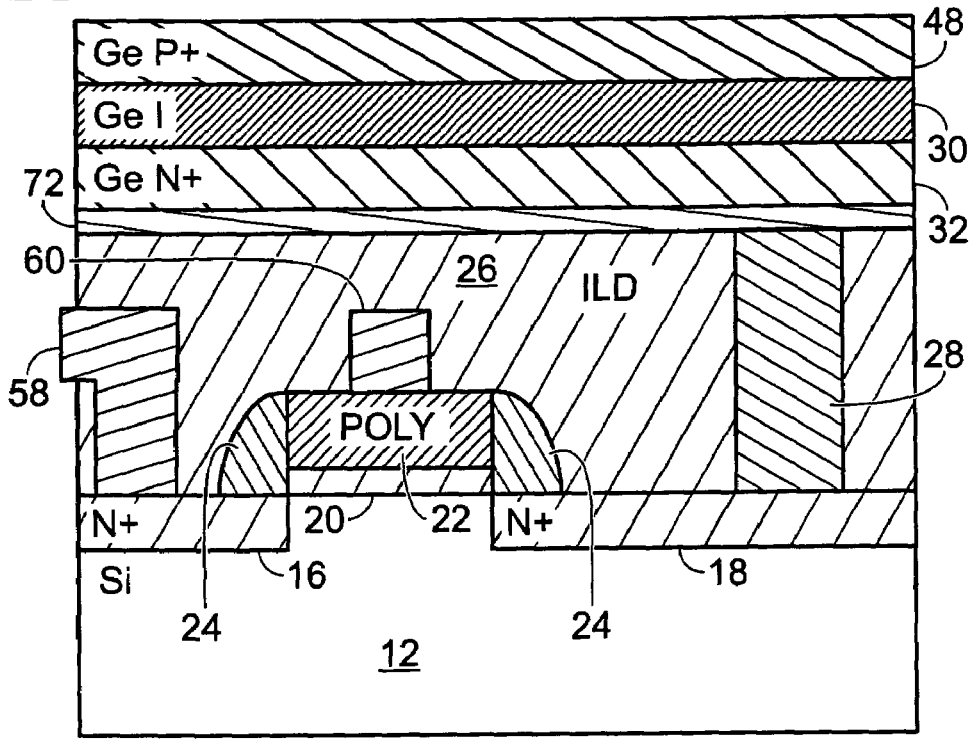
FIG. 11 depicts a sensor constructed according to an alternate embodiment of the method of the invention.

Referring now to FIG. 11, yet another embodiment of the method of the invention is described. A reflective metal layer 72 may be added to the silicon integrated circuit wafer prior to the transfer of germanium thin film from germanium wafer to silicon wafer as part of step 34. The metal layer reflects the un-absorbed light back to the germanium layer. After metal interconnect of the integrated circuit is completed, top layer passivation oxide deposited and the germanium photo sensor bottom layer contact plug and CMP planarization are completed, a thin layer of metal, such as Al, Au, Ag, W, Ni, Pd, Ir, or Pt, is deposited, followed by the germanium wafer bonding thin film transfer. It is to be understood that the adhesion between germanium and the metal layer may not be adequate for the bonding operation, and that it may be necessary to deposit a thin layer of polysilicon, e.g., between about 5 nm to 20 nm, prior to transfer of germanium from the donor wafer to the handling wafer. As a result the provision of the metal layer, effective germanium layer thickness is increased. If the metal exhibits 100% reflection, the effective thickness of the germanium is 100% larger than its physical thickness. Therefore, the detector does not require as thick a germanium film to achieve a given quantum efficiency. From FIG. 13, it may be seen that Au, Ag, or Al are the best metals for this embodiment.

Figure 12:
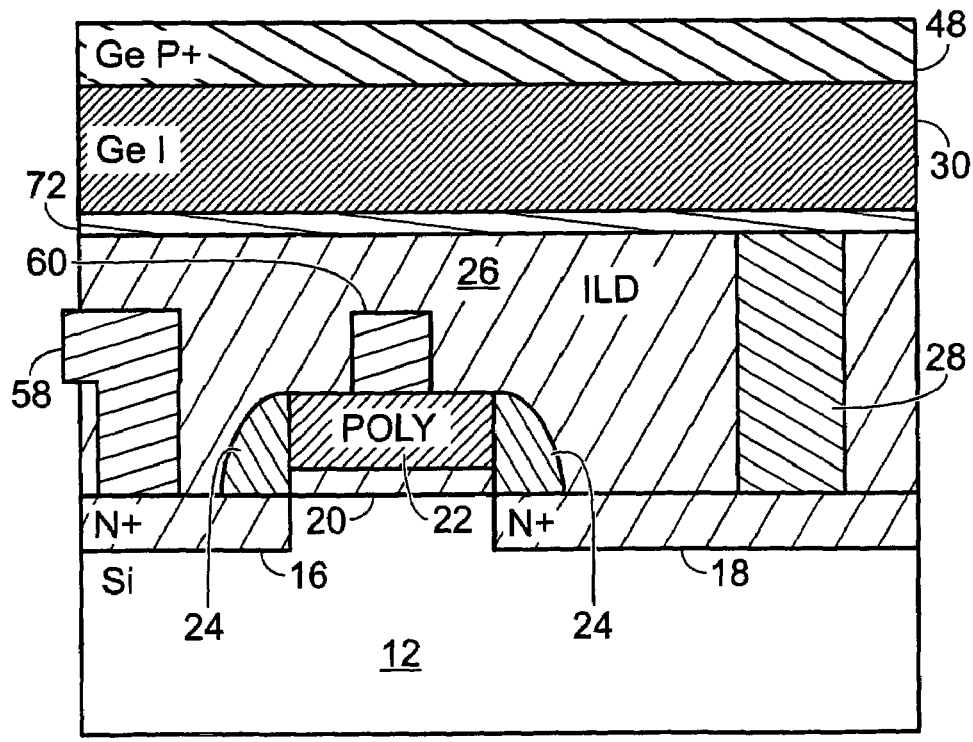
FIG. 12 depicts a sensor constructed according to another embodiment of the method of the invention.

In this embodiment of the method of the invention, shown in FIG. 12, N+ Ge layer 32 is omitted, however, the metal work function has to be larger than that of the germanium work function. Metal layer 72 is the back electrode of the light detector. Any metal with a work function larger than 5 eV may be used. If the work function of this metal layer is too low, the dark current of the detector may be increased. This metal also acts as reflective layer. Therefore the higher the metal reflection coefficient the better the light detection will be. Some of the common metals which may be used are Au, Ni, Pd, Ir, and Pt. From FIG. 13, Au is seen to be the best reflector.

Figure 13:
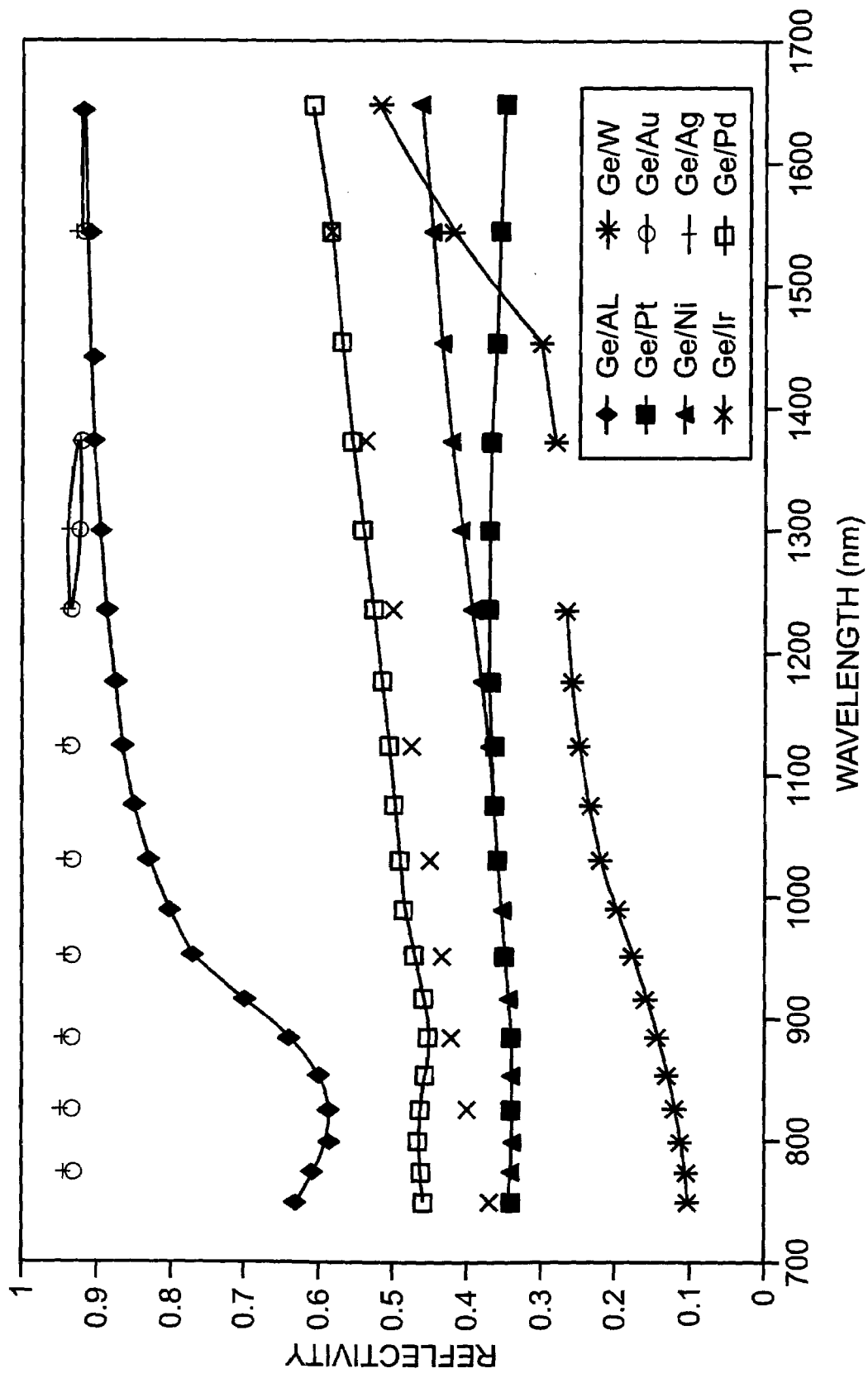
FIG. 13 depicts the reflectivity of various metals deposited below a germanium layer.

FIG. 13 depicts the calculated reflectivity of various metal films when formed under the germanium layer. It will be understood by one of ordinary skill in the art that the calculations used to construct FIG. 13 ignore the comparatively small absorption coefficient of germanium. It is apparent that Au and Ag are the best mirrors in the near-IR regime, reflecting over 90% of the incident light. Al is next best, while the other metals are not considered to be effective when used as described herein.

Thus, a method of fabricating a thin film germanium infrared sensor by bonding to silicon wafer has been disclosed. It will be appreciated that further variations and modifications thereof may be made within the scope of the invention as defined in the appended claims.

We claim:

1. A method of fabricating a thin film germanium photodetector, comprising:
   seriatim
   preparing a silicon substrate;
   fabricating a CMOS device on the silicon substrate;
   preparing a germanium substrate;
   preparing surfaces of each substrate for bonding;
   bonding the germanium substrate to the CMOS-bearing silicon substrate to form a bonded structure;
   removing a portion of the germanium substrate from the bonded structure;
   forming a PIN diode in the germanium substrate;
   removing a portion of the germanium layer by etching; and
   completing the germanium photo detector.

2. The method of claim 1 which includes, after said preparing a germanium substrate, implanting splitting ions into the germanium substrate to a splitting depth, Rp; and, wherein said removing a portion of the germanium substrate from the bonded structure includes splitting a portion of the germanium substrate along the splitting depth.

3. The method of claim 2 wherein said implanting splitting ions into the germanium substrate includes implanting ions taken from the group of ions consisting of hydrogen, helium, argon, and a combination thereof, at an implantation dose of between 5e15cm$^{-2}$ to 5e17cm$^{-2}$, depth Rp of between about 0.3 μm to 2.0 μm, splitting the bonded structure by furnace annealing at a temperature of between about 200° C. to 600° C., and smoothing the now split germanium surface.

4. The method of claim 1 wherein said preparing a germanium substrate includes implanting ions in the germanium substrate to form a N+Ge layer on the substrate, and wherein the N+Ge layer is bonded to the CMOS-bearing silicon substrate.

5. The method of claim 1 which further includes depositing a metal layer on the CMOS-bearing silicon substrate prior to said bonding, wherein the metal is taken from the group of metals consisting of Al, Au, W, Ni. Pd, Ir and Pt.

6. The method of claim 1 wherein said preparing surfaces of each substrate for bonding includes treating the surfaces by dipping in a solution taken from the group of solutions consisting of $H_2SO_4+H_2O_2+H_2O$, $NH_4OH+H_2O_2+H_2O$, $HF+H_2O$, and mixtures thereof.

7. The method of claim 1 wherein said bonding the germanium substrate to the CMOS-bearing silicon substrate to form a bonded structure includes bonding by a bonding technique taken from the group of bonding techniques consisting of direct bonding and direct bonding with a metal layer inserted therebetween.

8. The method of claim 1 wherein said forming a PIN diode in the germanium substrate includes forming a P+ layer by ion implantation of ions taken from the group of ions consisting of B and $BF_2$ ions, and which further includes activation of the implanted ions by a low temperature anneal at a temperature of between about 400° C. to 800° C., to form a Ge P+ layer.

9. The method of claim 1 wherein said forming a PIN diode in the germanium substrate includes forming a P+ layer by an in-situ B-doped germanium epitaxy process by CVD or MBE, performed at a temperature of between about 350° C. to 500° C.

10. The method of claim 1 which includes deposition of a metal layer on the germanium substrate after transfer of the germanium layer, wherein the metal in the metal layer is taken from the group of metals consisting of Ni, Ti, W, Mo, Cu, Zr and Co.

11. The method of claim 1 wherein said preparation of a germanium substrate further includes deposition of a metal layer on the germanium substrate, wherein the metal in the metal layer is taken from the group of metals consisting of Au, Ni, Pd, Ir and Pt.

12. A method of fabricating a thin film germanium photodetector, comprising:
    seriatim
    preparing a silicon substrate;
    fabricating a CMOS device on the silicon substrate;
    depositing a metal layer on the CMOS-bearing silicon substrate;
    preparing a germanium substrate;
    preparing surfaces of each substrate for bonding;
    bonding the germanium substrate to the CMOS-bearing silicon substrate to form a bonded structure;
    removing a portion of the germanium substrate from the bonded structure;
    forming a PIN diode by ion implantation and activation in the germanium substrate, including forming a P+ layer by implantation of ions taken from the group of ions consisting of B and $BF_2$ ions, and wherein said activation includes a low temperature anneal at a temperature of between about 400° C. to 800° C., to form a Ge P+ layer;
    removing a portion of the germanium layer by etching; and
    completing the germanium photo detector.

13. The method of claim 12 which includes, after said preparing a germanium substrate, implanting splitting ions into the germanium substrate to a splitting depth, Rp; and, wherein said removing a portion of the germanium substrate from the bonded structure includes splitting a portion of the germanium substrate along the splitting depth.

14. The method of claim 13 wherein said implanting splitting ions into the germanium substrate includes implanting ions taken from the group of ions consisting of hydrogen, helium, argon, and a combination thereof, at an implantation dose of between $5e15 cm^{-2}$ to $5e17 cm^{-2}$, depth Rp of between about 0.3 μm to 2.0 μm, splitting the bonded structure by furnace annealing at a temperature of between about 200° C. to 600° C., and smoothing the now split germanium surface.

15. The method of claim 12 wherein said preparing a germanium substrate includes implanting ions in the germanium substrate to form a N+Ge layer on the substrate, and wherein the N+Ge layer is bonded to the CMOS-bearing silicon substrate.

16. The method of claim 12 wherein said depositing a metal layer on the CMOS-bearing silicon substrate includes depositing a metal layer taken from the group of metals consisting of Al, Au, W, Ni. Pd, Ir and Pt.

17. The method of claim 12 wherein said preparing surfaces of each substrate for bonding includes treating the surfaces by dipping in a solution taken from the group of solutions consisting of $H_2SO_4+H_2O_2+H_2O$, $NH_4OH+H_2O_2+H_2O$, $HF+H_2O$, and mixtures thereof.

18. The method of claim 12 wherein said bonding the germanium substrate to the CMOS-bearing silicon substrate to form a bonded structure includes bonding by a bonding technique taken from the group of bonding techniques consisting of direct bonding and direct bonding with a metal layer inserted therebetween.

19. The method of claim 12 which includes deposition of a metal layer on the germanium substrate after transfer of the germanium layer, wherein the metal in the metal layer is taken from the group of metals consisting of Ni, Ti, W, Mo, Cu, Zr and Co.

20. The method of claim 12 wherein said preparation of a germanium substrate further includes deposition of a metal layer on the germanium substrate, wherein the metal in the metal layer is taken from the group of metals consisting of Au, Ni, Pd, Ir and Pt.

* * * * *

UNITED STATES PATENT AND TRADEMARK OFFICE
CERTIFICATE OF CORRECTION

| | | |
|---|---|---|
| PATENT NO. | : 7,157,300 B2 | |
| APPLICATION NO. | : 10/993533 | |
| DATED | : January 2, 2007 | |
| INVENTOR(S) | : Jong-Jan Lee et al. | |

It is certified that error appears in the above-identified patent and that said Letters Patent is hereby corrected as shown below:

Claim 3:

Column 5, line 66, after "5e17 cm-2" insert --to a--

Claim 14:

Column 7, line 11, after "5e17 cm-2," insert --to a--

Signed and Sealed this

Tenth Day of April, 2007

JON W. DUDAS
*Director of the United States Patent and Trademark Office*